United States Patent
Zhang et al.

(10) Patent No.: US 12,156,428 B2
(45) Date of Patent: Nov. 26, 2024

(54) DISPLAY PANEL ENHANCING TIMELINESS OF DATA SIGNAL TRANSMISSION AND DISPLAY DEVICE WITH THE SAME

(71) Applicant: WUHAN CHINA STAR OPTOELECTRONICS SEMICONDUCTOR DISPLAY TECHNOLOGY CO., LTD., Hubei (CN)

(72) Inventors: Jun Zhang, Hubei (CN); Songpo Xiang, Hubei (CN); Tao Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 406 days.

(21) Appl. No.: 17/607,434

(22) PCT Filed: Sep. 1, 2021

(86) PCT No.: PCT/CN2021/115982
§ 371 (c)(1),
(2) Date: Oct. 29, 2021

(87) PCT Pub. No.: WO2023/024133
PCT Pub. Date: Mar. 2, 2023

(65) Prior Publication Data
US 2023/0066643 A1    Mar. 2, 2023

(30) Foreign Application Priority Data
Aug. 24, 2021   (CN) .......................... 202110972132.0

(51) Int. Cl.
*G09G 3/30* (2006.01)
*G09G 3/32* (2016.01)
(Continued)

(52) U.S. Cl.
CPC ........... *H10K 59/1213* (2023.02); *G09G 3/32* (2013.01); *G09G 3/3275* (2013.01);
(Continued)

(58) Field of Classification Search
CPC .... H10K 59/1213; H10K 59/131; G09G 3/32; G09G 3/3275; G09G 3/3688;
(Continued)

(56) References Cited

U.S. PATENT DOCUMENTS

| 2011/0025936 | A1  | 2/2011 | Chang |
| 2016/0078836 | A1* | 3/2016 | Kim ..................... G09G 3/3688 345/209 |
| 2021/0020724 | A1* | 1/2021 | Cho ..................... G09G 3/3266 |

FOREIGN PATENT DOCUMENTS

| CN | 105913791 A | 8/2016 |
| CN | 108181770 A | 6/2018 |

(Continued)

OTHER PUBLICATIONS

International Search Report in International application No. PCT/CN2021/115982, mailed on May 19, 2022.
(Continued)

*Primary Examiner* — Sanghyuk Park
(74) *Attorney, Agent, or Firm* — Rivka Friedman

(57) ABSTRACT

A display panel and a display device are provided. In the display panel, at least one odd-numbered thin film transistor is sequentially turned on to charge sub-pixels of a corresponding odd-numbered row before charging sub-pixels of any one of odd-numbered rows is finished, and at least one even-numbered thin film transistor is sequentially turned on (Continued)

to charge sub-pixels of a corresponding even-numbered row before charging sub-pixels of any one of even-numbered rows is finished, thereby saving the number of uses of data traces and thin film transistors, as well as enhancing the timeliness of data signal transmission.

18 Claims, 8 Drawing Sheets

(51) Int. Cl.
*G09G 3/3275* (2016.01)
*G09G 3/36* (2006.01)
*H10K 59/121* (2023.01)
*H10K 59/131* (2023.01)

(52) U.S. Cl.
CPC ......... *G09G 3/3688* (2013.01); *H10K 59/131* (2023.02); *G09G 2310/0278* (2013.01); *G09G 2310/0297* (2013.01); *G09G 2310/08* (2013.01)

(58) Field of Classification Search
CPC ... G09G 2310/0278; G09G 2310/0297; G09G 2310/08
See application file for complete search history.

(56) References Cited

FOREIGN PATENT DOCUMENTS

| | | |
|---|---|---|
| CN | 108594554 A | 9/2018 |
| CN | 109637414 A | 4/2019 |
| CN | 109904214 A | 6/2019 |
| CN | 110178175 A | 8/2019 |
| CN | 110517636 A | 11/2019 |
| CN | 110808005 A | 2/2020 |
| CN | 111161667 A | 5/2020 |
| CN | 112071253 A | 12/2020 |
| CN | 112687237 A | 4/2021 |
| CN | 112925448 A | 6/2021 |
| CN | 113257130 A | 8/2021 |

OTHER PUBLICATIONS

Written Opinion of the International Search Authority in International application No. PCT/CN2021/115982, mailed on May 19, 2022.

Chinese Office Action issued in corresponding Chinese Patent Application No. 202110972132.0 dated Mar. 7, 2023, pp. 1-9.

* cited by examiner

DISPLAY PANEL ENHANCING TIMELINESS OF DATA SIGNAL TRANSMISSION AND DISPLAY DEVICE WITH THE SAME

BACKGROUND OF THE INVENTION

Field of the Invention

The present disclosure relates to a field of display technology, and more specifically to a display panel and a display device.

BACKGROUND OF THE INVENTION

As shown in FIG. 1, a cascaded multiplexing circuit is generally used in a traditional art to save fan-out traces. However, in the cascaded multiplexing circuit, when a data signal X1 and a data signal X2 are transmitted to corresponding pixels, the data signal X1 or the data signal X2 needs to pass through two thin film transistors. Therefore, there is a high transmission impedance in the cascaded multiplexing circuit, thereby causing a large delay for a data signal, so as to affect the display effect thereof.

It should be noted that the above description of the background is merely provided for clear and complete understanding of the present disclosure. Therefore, it should not be understood that the above technical solution is known to those skilled in the art as it is described in the background of the present disclosure.

SUMMARY OF THE INVENTION

The present disclosure provides a display panel and a display device, that can ease the technical problems of a transmission delay caused by a data signal being transmitted to a panel and then needed to pass through a great number of thin film transistors based on saving of data traces.

In a first aspect, the present disclosure provides a display panel. The display panel includes a sub-pixel array, a plurality of data lines, a multiplexing circuit, and a driving circuit. A first column of sub-pixels to an N-th column of sub-pixels are sequentially arranged along a first direction in the sub-pixel array, and a first row of sub-pixels to an M-th row of sub-pixels are sequentially arranged along a second direction in the sub-pixel array. First sub-pixels located in odd-numbered rows and second sub-pixels located in even-numbered rows are included in each column of sub-pixels. M and N are each a positive integer. The plurality of data lines are sequentially arranged along the first direction. A (2N−1)-th data line located at one side of the N-th column of sub-pixels is electrically connected to sub-pixels of odd-numbered rows in the N-th column of sub-pixels, and a (2N)-th data line located at another side of the N-th column of sub-pixels is electrically connected to sub-pixels of even-numbered rows in the N-th column of sub-pixels. The multiplexing circuit includes at least one multiplexing module, and the multiplexing module includes at least one odd-numbered thin film transistor and at least one even-numbered thin film transistor. An output terminal of one of the at least one odd-numbered thin film transistor is electrically connected to a corresponding odd-numbered data line, and an output terminal of one of the at least one even-numbered thin film transistor is electrically connected to a corresponding even-numbered data line. An output terminal of the driving circuit is electrically connected to an input terminal of the odd-numbered thin film transistor and an input terminal of the even-numbered thin film transistor in the same multiplexing module. The at least one odd-numbered thin film transistor is sequentially turned on before charging the sub-pixels of any one of the odd-numbered rows is finished in the display panel, and the at least one even-numbered thin film transistor is sequentially turned on before charging the sub-pixels of any one of the even-numbered rows is finished in the display panel.

In some of embodiments, the at least one odd-numbered thin film transistor and the at least one even-numbered thin film transistor are alternately arranged in sequence along the first direction. The at least one odd-numbered thin film transistor is sequentially turned on along the first direction before charging the sub-pixels of any one of the odd-numbered rows is finished in the display panel, and the at least one even-numbered thin film transistor is sequentially turned on along the first direction before charging the sub-pixels of any one of the even-numbered rows is finished in the display panel.

In some of embodiments, the display panel further includes a plurality of scanning lines, and the plurality of scanning lines are sequentially arranged along the second direction. An M-th scanning line is electrically connected to the M-th row of sub-pixels. The M-th scanning line is used for transmitting a corresponding scanning signal to control a charging start time and a charging end time of corresponding row of sub-pixels, and M is a positive integer. The at least one odd-numbered thin film transistor is sequentially turned on to pre-charge a data signal to a corresponding odd-numbered data line before the charging start time of the sub-pixels of any one of the odd-numbered rows. The at least one even-numbered thin film transistor is sequentially turned on to pre-charge a data signal to a corresponding even-numbered data line before the charging start time of the sub-pixels of any one of the even-numbered rows.

In some of embodiments, the data signal is charged to sub-pixels of a corresponding odd-numbered row at the charging start time of the sub-pixels of any one of the odd-numbered rows, and the data signal is charged to sub-pixels of a corresponding even-numbered row at the charging start time of the sub-pixels of any one of the even-numbered rows.

In some of embodiments, the at least one even-numbered thin film transistor is sequentially turned on to pre-charge the data signal to the corresponding even-numbered data line after the charging start time of an (2M−1)-th row of sub-pixels, before the charging start time of an (2M)-th row of sub-pixels. The at least one odd-numbered thin film transistor is sequentially turned on to pre-charge the data signal to the corresponding odd-numbered data line after the charging start time of the (2M)-th row of sub-pixels, before the charging start time of an (2M+1)-th row of sub-pixels.

In some of embodiments, the display panel further includes a plurality of first traces and a plurality of second traces. One of the first traces is electrically connected to a gate electrode of one of the at least one odd-numbered thin film transistor, and is used for transmitting a plurality of first strobe signals with a successive change in phase. One of the second traces is electrically connected to a gate electrode of one of the at least one even-numbered thin film transistor, and is used for transmitting a plurality of second strobe signals with a successive change in phase. A pulse of a (2M−1)-th stage scanning signal and a pulse of at least one of the second strobe signals are within a same time segment; a start time of the pulse of the (2M−1)-th stage scanning signal is within a pulse of one of the first strobe signals, and the (2M−1)-th stage scanning signal is a scanning signal transmitted from a (2M−1)-th scanning line.

In some of embodiments, the multiplexing module includes a first odd-numbered thin film transistor, a second odd-numbered thin film transistor, a first even-numbered thin film transistor, and a second even-numbered thin film transistor. One of a source electrode and a drain electrode of the first odd-numbered thin film transistor is electrically connected to a first data line. One of a source electrode and a drain electrode of the second odd-numbered thin film transistor is electrically connected to a third data line. One of a source electrode and a drain electrode of the first even-numbered thin film transistor is electrically connected to a second data line. One of a source electrode and a drain electrode of the second even-numbered thin film transistor is electrically connected to a fourth data line. The driving circuit includes a first output terminal. The first output terminal is electrically connected to another one of the source electrode and the drain electrode of the first odd-numbered thin film transistor, another one of the source electrode and the drain electrode of the second odd-numbered thin film transistor, another one of the source electrode and the drain electrode of the first even-numbered thin film transistor, and another one of the source electrode and the drain electrode of the second even-numbered thin film transistor.

In some of embodiments, the multiplexing module further includes a third odd-numbered thin film transistor and a third even-numbered thin film transistor. One of a source electrode and a drain electrode of the third odd-numbered thin film transistor is electrically connected to a fifth data line, and another one of the source electrode and the drain electrode of the third odd-numbered thin film transistor is electrically connected to the first output terminal. One of a source electrode and a drain electrode of the third even-numbered thin film transistor is electrically connected to a sixth data line, and another one of the source electrode and the drain electrode of the third even-numbered thin film transistor is electrically connected to the first output terminal.

In some of embodiments, the multiplexing module further includes a fourth odd-numbered thin film transistor and a fourth even-numbered thin film transistor. One of a source electrode and a drain electrode of the fourth odd-numbered thin film transistor is electrically connected to a seventh data line, and another one of the source electrode and the drain electrode of the fourth odd-numbered thin film transistor is electrically connected to the first output terminal. One of a source electrode and a drain electrode of the fourth even-numbered thin film transistor is electrically connected to an eighth data line, and another one of the source electrode and the drain electrode of the fourth even-numbered thin film transistor is electrically connected to the first output terminal.

In some of embodiments, the display panel further includes a display area and a non-display area. The plurality of data lines are located in the display area. The non-display area includes a first non-display sub-area. The first non-display sub-area includes a circuit placement area, a first fan-out area, a bending area and a second fan-out area that are respectively progressively farther from the display area. The multiplexing circuit is disposed on the circuit placement area.

In a second aspect, the present disclosure provides a display device including the display panel according to any one of the above embodiments.

In the display panel and the display device of the present disclosure, the at least one odd-numbered thin film transistor can be sequentially turned on to charge sub-pixels of a corresponding odd-numbered row before charging the sub-pixels of any one of the odd-numbered rows is finished, the at least one even-numbered thin film transistor can be sequentially turned on to charge sub-pixels of a corresponding even-numbered row before charging the sub-pixels of any one of the even-numbered rows is finished, by electrically connecting the output terminal of the driving circuit to the input terminal of the odd-numbered thin film transistor and the input terminal of the even-numbered thin film transistor in the same multiplexing module, electrically connecting the output terminal of one of the at least one odd-numbered thin film transistor to the corresponding odd-numbered data line, electrically connecting the output terminal of one of the at least one even-numbered thin film transistor to the corresponding even-numbered data line, electrically connecting the (2N−1)-th data line to the sub-pixels of the odd-numbered rows in the N-th column of sub-pixels, and electrically connecting the (2N)-th data line to the sub-pixels of the even-numbered rows in the N-th column of sub-pixels, thereby saving the number of uses of data traces and thin film transistors, as well as enhancing the timeliness of data signal transmission.

DETAILED DESCRIPTION OF THE PREFERRED EMBODIMENTS

Figure 1:
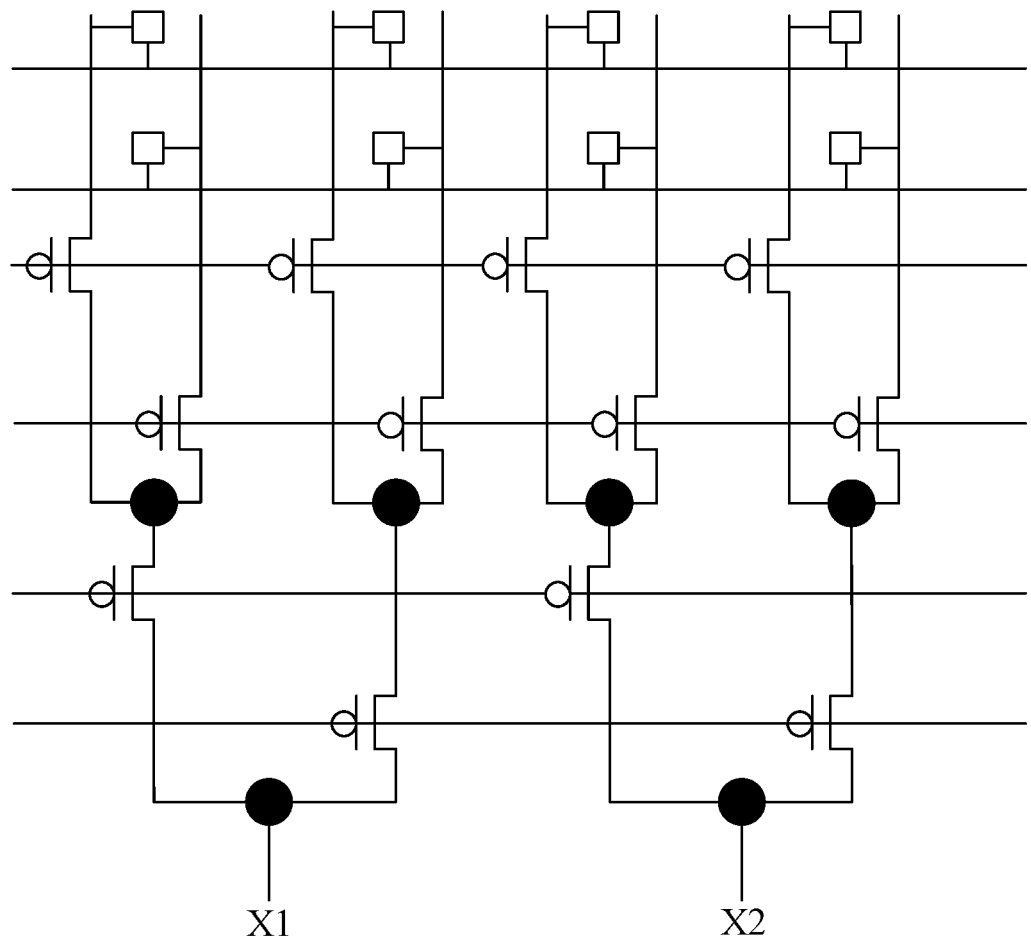
FIG. 1 is a schematic view of a structure of a display panel in a traditional art.

In order to more clearly and definitely illustrate aim, the technical scheme and effects of the present disclosure, the present disclosure will further be described in detail below with reference to the accompanying drawings and embodiments. It should be understood that the specific embodiments described herein are only used to explain the present disclosure, and are not used to limit the present disclosure.

Please refer to FIGS. 2-8. The present embodiment provides a display panel including a sub-pixel array, a plurality of data lines DL, a multiplexing circuit 200, and a driving circuit 300. A first column of sub-pixels to an N-th column of sub-pixels are sequentially arranged along a first direction DR1 in the sub-pixel array, a first row of sub-pixels to an M-th row of sub-pixels are sequentially arranged along a second direction DR2 in the sub-pixel array, and M and N are each a positive integer. The plurality of data lines DL are sequentially arranged along the first direction DR1. A (2N−1)-th data line located at one side of the N-th column of sub-pixels is electrically connected to sub-pixels of odd-numbered rows in the N-th column of sub-pixels, and a (2N)-th data line located at another side of the N-th column of sub-pixels is electrically connected to sub-pixels of even-numbered rows in the N-th column of sub-pixels. The multiplexing circuit 200 includes at least one multiplexing module 210, and the multiplexing module 210 includes at least one odd-numbered thin film transistor and at least one even-numbered thin film transistor. An output terminal of one of the at least one odd-numbered thin film transistor is electrically connected to a corresponding odd-numbered data line, and an output terminal of one of the at least one even-numbered thin film transistor is electrically connected to a corresponding even-numbered data line. An output terminal of the driving circuit 300 is electrically connected to an input terminal of the odd-numbered thin film transistor and an input terminal of the even-numbered thin film transistor in the same multiplexing module 210. The at least one odd-numbered thin film transistor is sequentially turned on before charging the sub-pixels of any one of the odd-numbered rows is finished in the display panel, and the at least one even-numbered thin film transistor is sequentially turned on before charging the sub-pixels of any one of the even-numbered rows is finished in the display panel.

In the display panel of the present embodiment, it should be understood that the at least one odd-numbered thin film transistor can be sequentially turned on to charge sub-pixels of a corresponding odd-numbered row before charging the sub-pixels of any one of the odd-numbered rows is finished, the at least one even-numbered thin film transistor can be sequentially turned on to charge sub-pixels of a corresponding even-numbered row before charging the sub-pixels of any one of the even-numbered rows is finished, by electrically connecting the output terminal of the driving circuit 300 to the input terminal of the odd-numbered thin film transistor and the input terminal of the even-numbered thin film transistor in the same multiplexing module 210, electrically connecting the output terminal of one of the at least one odd-numbered thin film transistor to the corresponding odd-numbered data line, electrically connecting the output terminal of one of the at least one even-numbered thin film transistor to the corresponding even-numbered data line, electrically connecting the (2N−1)-th data line to the sub-pixels of the odd-numbered rows in the N-th column of sub-pixels, and electrically connecting the (2N)-th data line to the sub-pixels of the even-numbered rows in the N-th column of sub-pixels, thereby saving the number of uses of data traces and thin film transistors, as well as enhancing the timeliness of data signal transmission.

In the present embodiment, it should be noted that any column of sub-pixels 100 may include a plurality of sub-pixels 10, and any row of sub-pixels may also include a plurality of sub-pixels 10.

In one of embodiments, the display panel further includes a plurality of scanning lines, and the plurality of scanning lines are sequentially arranged along the second direction DR2. An M-th scanning line is electrically connected to the M-th row of sub-pixels. The M-th scanning line is used for transmitting a corresponding scanning signal to control a charging start time and a charging end time of corresponding row of sub-pixels, and M is a positive integer. The at least one odd-numbered thin film transistor is sequentially turned on to pre-charge a data signal to a corresponding odd-numbered data line before the charging start time of the sub-pixels of any one of the odd-numbered rows. The at least one even-numbered thin film transistor is sequentially turned on to pre-charge a data signal to a corresponding even-numbered data line before the charging start time of the sub-pixels of any one of the even-numbered rows.

It should be noted that one pulse of a scanning signal is corresponded to one charging start time and one charging end time. For example, when corresponding sub-pixels 10 are needed to be turned on by a positive-going pulse, a rising edge is corresponded to one charging start time, and a falling edge is corresponded to one charging end time. Conversely, when corresponding sub-pixels 10 are needed to be turned on by a negative-going pulse, a falling edge is corresponded to one charging start time, and a rising edge is corresponded to one charging end time. In the present embodiment, a corresponding data line DL can be pre-charged before the charging start time to perform preparatory work in advance with regard to further charge to the corresponding sub-pixels 10, and thereby it is advantageous to increase the charging efficiency thereof.

In one of embodiments, the data signal is charged to sub-pixels of a corresponding odd-numbered row at the charging start time of the sub-pixels of any one of the odd-numbered rows, and the data signal is charged to sub-pixels of a corresponding even-numbered row at the charging start time of the sub-pixels of any one of the even-numbered rows.

In the present embodiment, it should be understood that pre-charge quantities on the data lines DL are simultaneously written to one corresponding row of sub-pixels at the charging start time, so that the charging uniformity of the corresponding row of sub-pixels can be effectively improved, thereby enhancing the luminance uniformity of the display panel.

In one of embodiments, the at least one even-numbered thin film transistor is sequentially turned on to pre-charge the data signal to the corresponding even-numbered data line after the charging start time of an (2M−1)-th row of sub-pixels, before the charging start time of an (2M)-th row of sub-pixels. The at least one odd-numbered thin film transistor is sequentially turned on to pre-charge the data signal to the corresponding odd-numbered data line after the charging start time of the (2M)-th row of sub-pixels, before the charging start time of an (2M+1)-th row of sub-pixels.

It should be noted that the (2M)-th row of sub-pixels can be simultaneously pre-charged at the charging time of the (2M−1)-th row of sub-pixels in the present embodiment, so that the charging efficiency of the display panel can be increased on the whole, and thereby it is advantageous to improve the problem of insufficient charge corresponding to a high refresh frequency. For example, the high refresh frequency can be the refresh frequency of 120 Hz and over.

Meanwhile, when the display panel is in a low frequency display state, due to there is a pre-charge voltage on the data lines DL, the leakage of the sub-pixels 10 caused by writing a thin film transistor can be effectively prevented, and thereby the low frequency display effect thereof can be improved.

In one of embodiments, the display panel further includes a plurality of first traces and a plurality of second traces. One of the first traces is electrically connected to a gate electrode of one of the at least one odd-numbered thin film transistor, and is used for transmitting a plurality of first strobe signals with a successive change in phase. One of the second traces is electrically connected to a gate electrode of one of the at least one even-numbered thin film transistor, and is used for transmitting a plurality of second strobe signals with a successive change in phase. A pulse of a (2M−1)-th stage scanning signal and a pulse of at least one of the second strobe signals are within a same time segment. A start time of the pulse of the (2M−1)-th stage scanning signal is within a pulse of one of the first strobe signals, and the (2M−1)-th stage scanning signal is a scanning signal transmitted from a (2M−1)-th scanning line.

Figure 2:
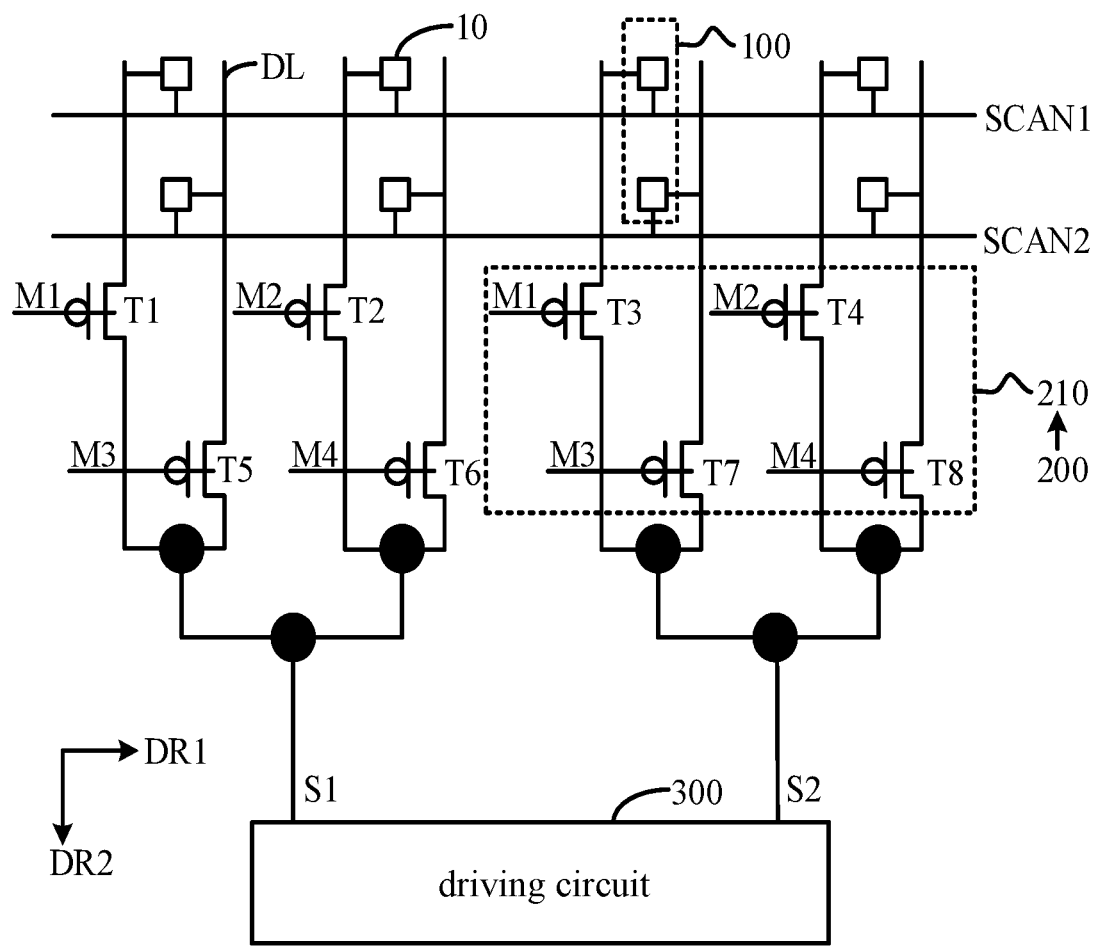
FIG. 2 is a schematic view of a first structure of a display panel according to an embodiment of the present disclosure.

As shown in FIG. 2, in one of embodiments, the multiplexing module 210 includes a first odd-numbered thin film transistor, a second odd-numbered thin film transistor, a first even-numbered thin film transistor, and a second even-numbered thin film transistor. One of a source electrode and a drain electrode of the first odd-numbered thin film transistor is electrically connected to a first data line. One of a source electrode and a drain electrode of the second odd-numbered thin film transistor is electrically connected to a third data line. One of a source electrode and a drain electrode of the first even-numbered thin film transistor is electrically connected to a second data line. One of a source electrode and a drain electrode of the second even-numbered thin film transistor is electrically connected to a fourth data line. The driving circuit 300 includes a first output terminal. The first output terminal is electrically connected to another one of the source electrode and the drain electrode of the first odd-numbered thin film transistor, another one of the source electrode and the drain electrode of the second odd-numbered thin film transistor, another one of the source electrode and the drain electrode of the first even-numbered thin film transistor, and another one of the source electrode and the drain electrode of the second even-numbered thin film transistor.

For example, in the present embodiment, the first odd-numbered thin film transistor can be a thin film transistor T1, the second odd-numbered thin film transistor can be a thin film transistor T2, the first even-numbered thin film transistor can be a thin film transistor T5, and the second even-numbered thin film transistor can be a thin film transistor T6. Alternatively, the first odd-numbered thin film transistor can also be a thin film transistor T3, the second odd-numbered thin film transistor can also be a thin film transistor T4, the first even-numbered thin film transistor can also be a thin film transistor T7, and the second even-numbered thin film transistor can also be a thin film transistor T8.

Figure 3:
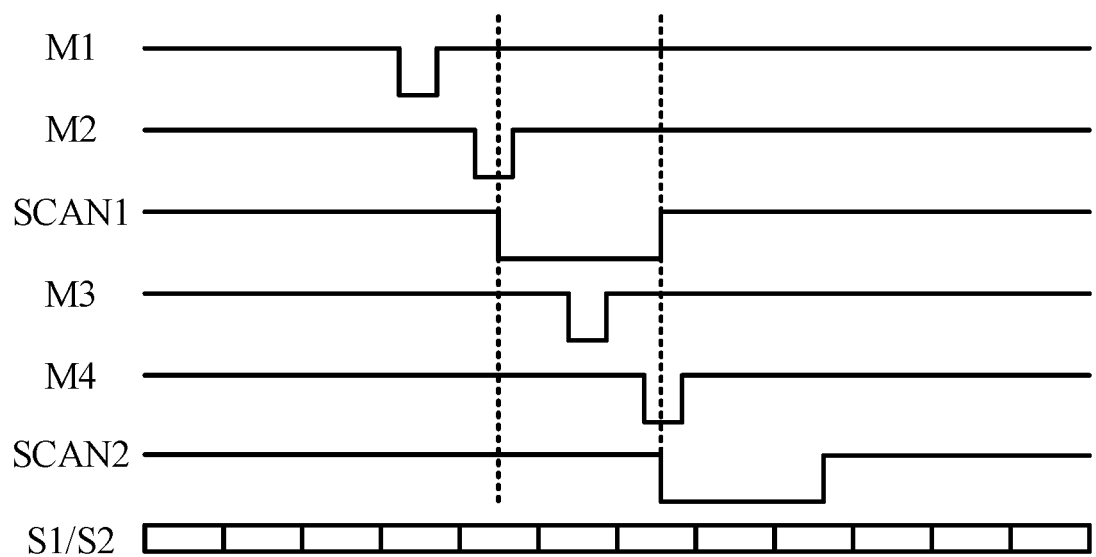
FIG. 3 is a timing diagram of the display panel of FIG. 2.

As shown in FIGS. 2-3, the thin film transistor T1 and the thin film transistor T2 are sequentially turned on by control of strobe signals M1 and strobe signals M2 to pre-charge source driving signals S1 to corresponding odd-numbered data lines before the charging start time of a first stage scanning signal SCAN1. The thin film transistor T5 and the thin film transistor T6 are sequentially turned on by control of strobe signals M3 and strobe signals M4 to pre-charge source driving signals S1 to corresponding even-numbered data lines before the charging start time of a second stage scanning signal SCAN2 Similarly, the thin film transistor T3 and the thin film transistor T4 are sequentially turned on by control of strobe signals M1 and strobe signals M2 to pre-charge source driving signals S2 to corresponding odd-numbered data lines before the charging start time of the first stage scanning signal SCAN1. The thin film transistor T7 and the thin film transistor T8 are sequentially turned on by control of strobe signals M3 and strobe signals M4 to pre-charge source driving signals S2 to corresponding even-numbered data lines before the charging start time of the second stage scanning signal SCAN2.

Figure 4:
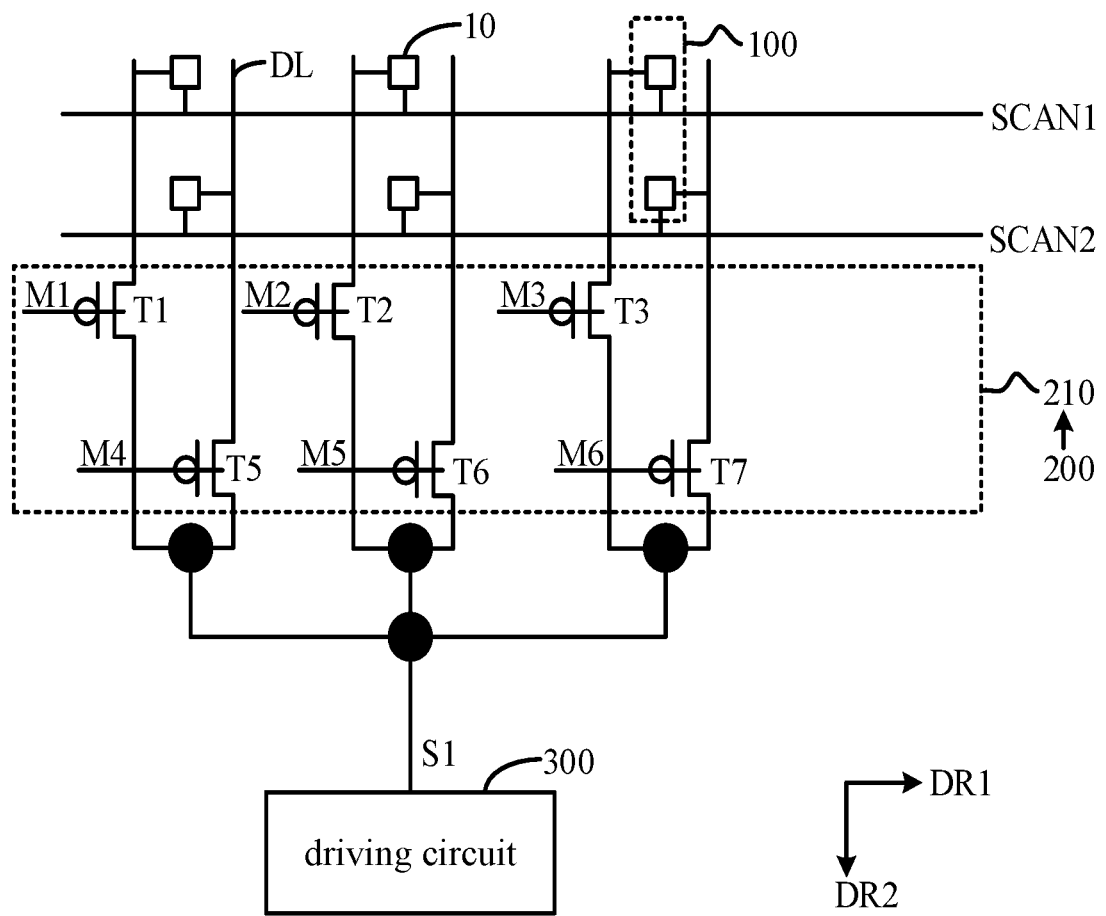
FIG. 4 is a schematic view of a second structure of a display panel according to an embodiment of the present disclosure.

As shown in FIG. 4, in one of embodiments, the multiplexing module 210 further includes a third odd-numbered thin film transistor and a third even-numbered thin film transistor. One of a source electrode and a drain electrode of the third odd-numbered thin film transistor is electrically connected to a fifth data line DL, and another one of the source electrode and the drain electrode of the third odd-numbered thin film transistor is electrically connected to the first output terminal. One of a source electrode and a drain electrode of the third even-numbered thin film transistor is electrically connected to a sixth data line DL, and another one of the source electrode and the drain electrode of the third even-numbered thin film transistor is electrically connected to the first output terminal.

For example, in the present embodiment, the first odd-numbered thin film transistor can be a thin film transistor T1, the second odd-numbered thin film transistor can be a thin film transistor T2, the third odd-numbered thin film transistor can be a thin film transistor T3, the first even-numbered thin film transistor can be a thin film transistor T5, the second even-numbered thin film transistor can be a thin film transistor T6, and the third even-numbered thin film transistor can be a thin film transistor T7.

Figure 5:
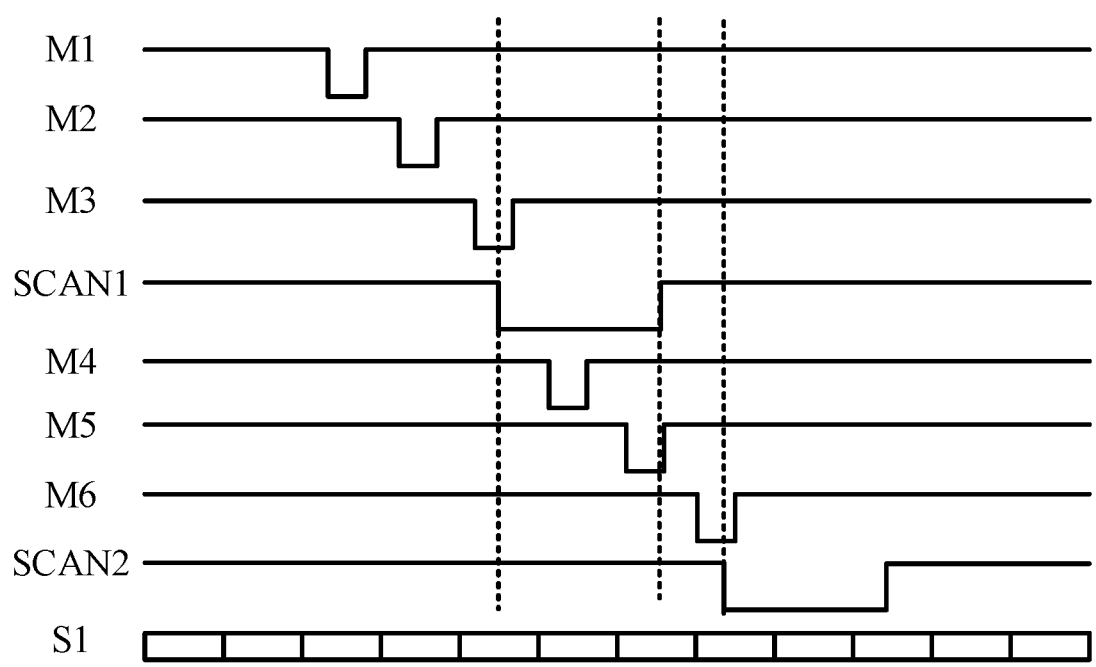
FIG. 5 is a timing diagram of the display panel of FIG. 4.

As shown in FIGS. 4-5, the thin film transistor T1, the thin film transistor T2, and the thin film transistor T3 are sequentially turned on by control of strobe signals M1, strobe signals M2 and strobe signals M3 to pre-charge source driving signals S1 to corresponding odd-numbered data lines before the charging start time of a first stage scanning signal SCAN1. The thin film transistor T5, the thin film transistor T6, and the thin film transistor T7 are sequentially turned on by control of strobe signals M4, strobe signals M5 and strobe signals M6 to pre-charge source driving signals S1 to corresponding even-numbered data lines before the charging start time of a second stage scanning signal SCAN2.

Figure 6:
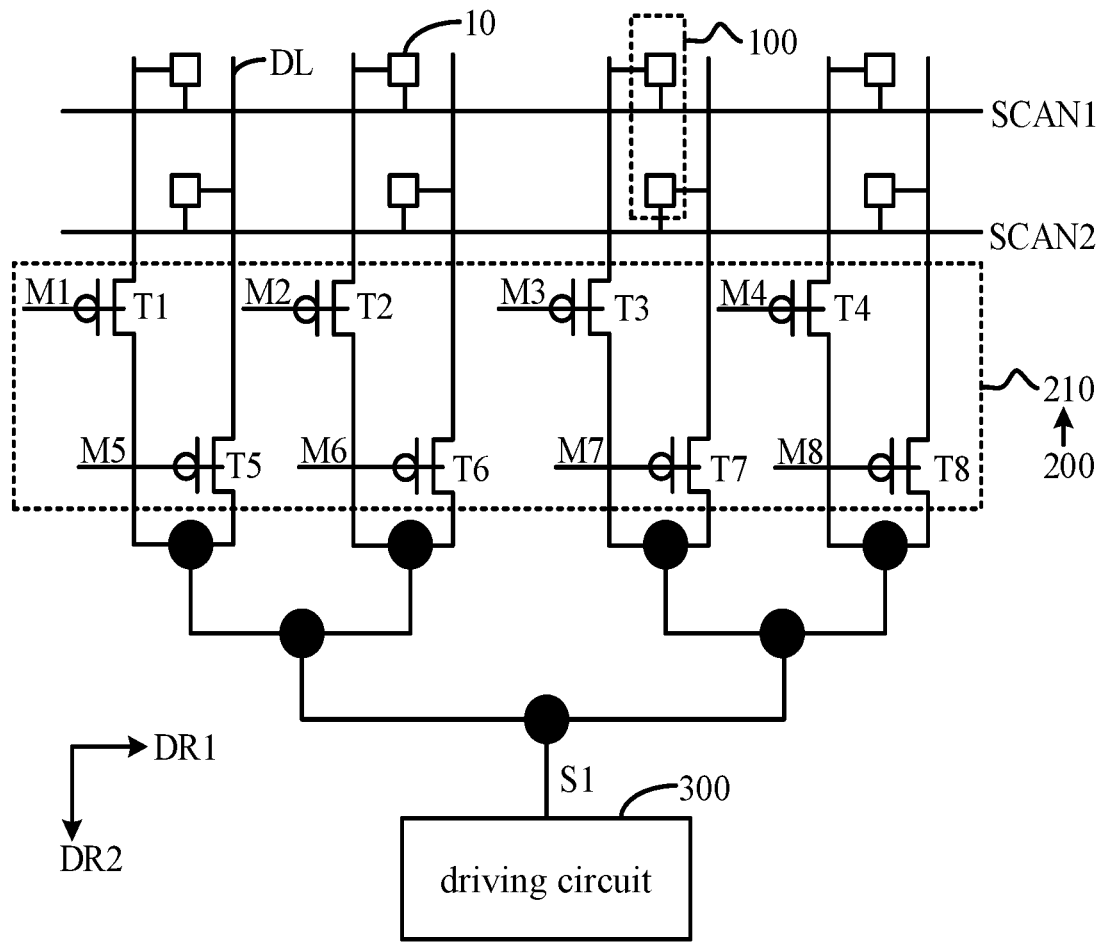
FIG. 6 is a schematic view of a third structure of a display panel according to an embodiment of the present disclosure.

As shown in FIG. 6, in one of embodiments, the multiplexing module 210 further includes a fourth odd-numbered thin film transistor and a fourth even-numbered thin film transistor. One of a source electrode and a drain electrode of the fourth odd-numbered thin film transistor is electrically connected to a seventh data line DL, and another one of the source electrode and the drain electrode of the fourth odd-numbered thin film transistor is electrically connected to the first output terminal. One of a source electrode and a drain electrode of the fourth even-numbered thin film transistor is electrically connected to an eighth data line DL, and another one of the source electrode and the drain electrode of the fourth even-numbered thin film transistor is electrically connected to the first output terminal.

For example, in the present embodiment, the first odd-numbered thin film transistor can be a thin film transistor T1, the second odd-numbered thin film transistor can be a thin film transistor T2, the third odd-numbered thin film transistor can be a thin film transistor T3, the fourth odd-numbered thin film transistor can be a thin film transistor T4, the first even-numbered thin film transistor can be a thin film transistor T5, the second even-numbered thin film transistor can be a thin film transistor T6, the third even-numbered thin film transistor can be a thin film transistor T7, and the fourth even-numbered thin film transistor can be a thin film transistor T8.

Figure 7:
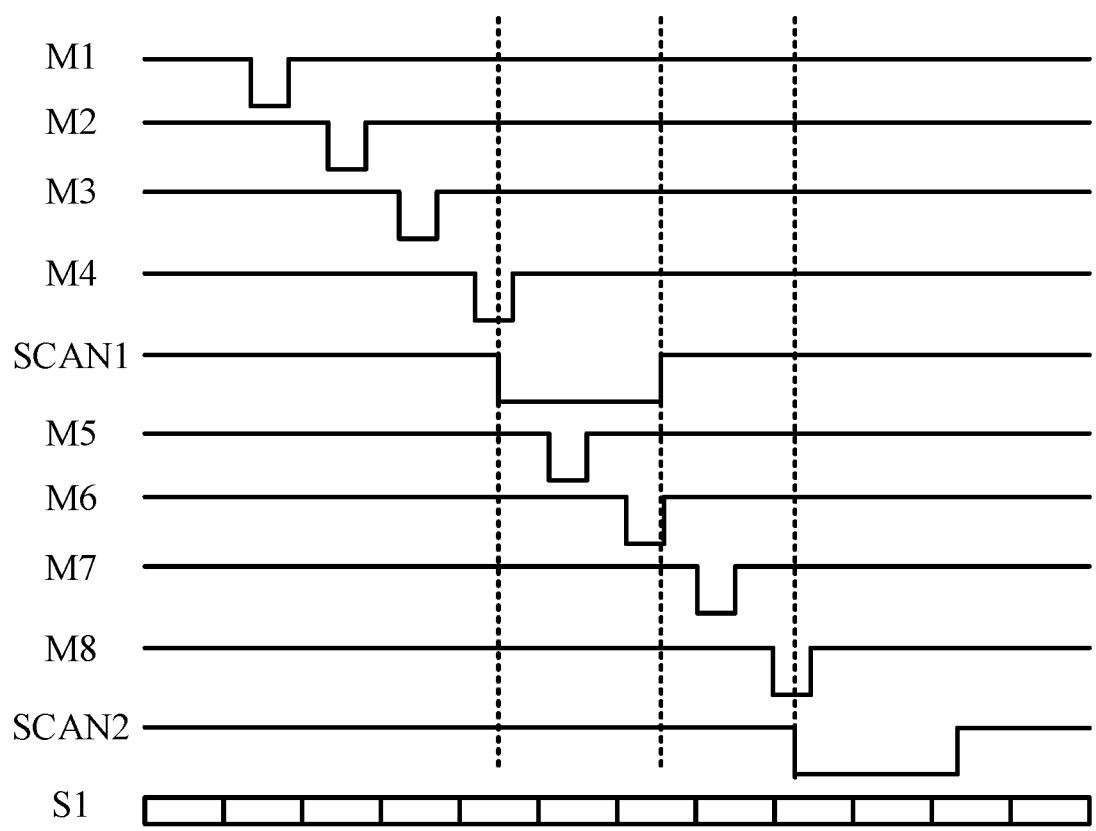
FIG. 7 is a timing diagram of the display panel of FIG. 6.

As shown in FIGS. 6-7, the thin film transistor T1, the thin film transistor T2, the thin film transistor T3, and the thin film transistor T4 are sequentially turned on by control of strobe signals M1, strobe signals M2, strobe signals M3 and strobe signals M4 to pre-charge source driving signals S1 to corresponding odd-numbered data lines before the charging start time of a first stage scanning signal SCAN1. The thin film transistor T5, the thin film transistor T6, the thin film transistor T7, and the thin film transistor T8 are sequentially turned on by control of strobe signals M5, strobe signals M6, strobe signals M7 and strobe signals M8 to pre-charge source driving signals S1 to corresponding even-numbered data lines before the charging start time of a second stage scanning signal SCAN2.

In one of embodiments, the thin film transistor in the multiplexing circuit 200 may be but not limited to a P-channel thin film transistor, and may also be an N-channel thin film transistor. Each strobe signals is correspondingly set as a positive pulse or a positive-going pulse if the thin film transistor in the multiplexing circuit 200 is an N-channel thin film transistor.

Figure 8:
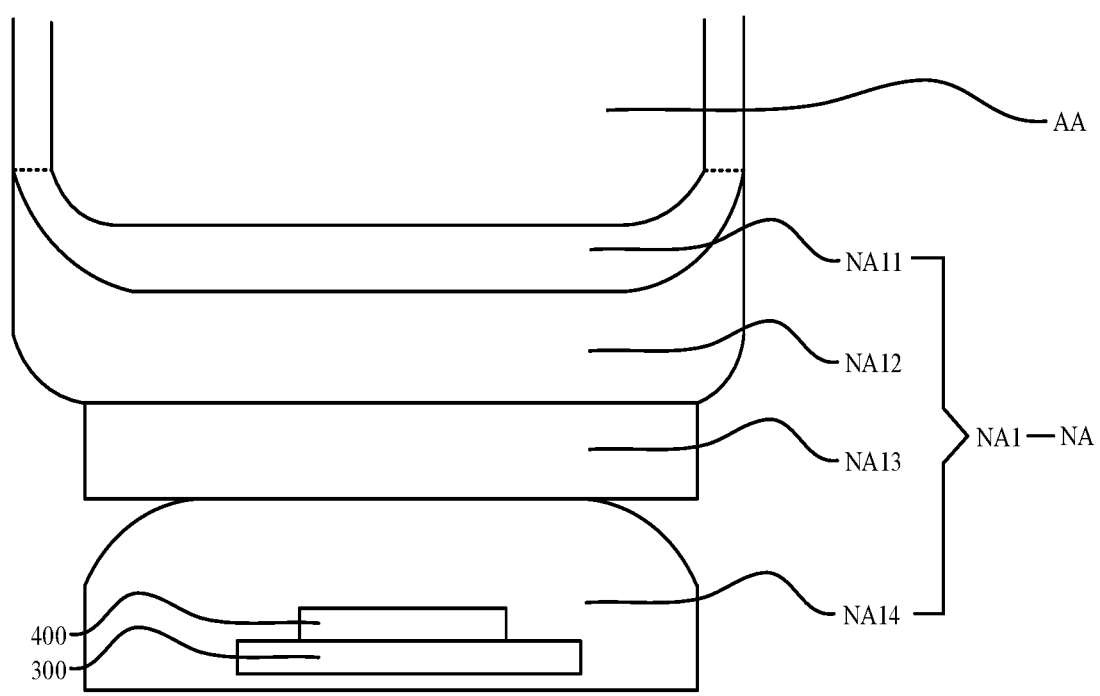
FIG. 8 is a schematic view of a fourth structure of a display panel according to an embodiment of the present disclosure.

As shown in FIG. 8, in one of embodiments, the display panel further includes a display area AA and a non-display area NA. The plurality of data lines DL are located in the display area AA. The non-display area NA includes a first non-display sub-area NA1. The first non-display sub-area NA1 includes a circuit placement area NA11, a first fan-out area NA12, a bending area NA13 and a second fan-out area NA14 that are respectively progressively farther from the display area AA. The multiplexing circuit 200 is disposed on the circuit placement area NA11.

In the present embodiment, it should be understood that the multiplexing circuit 200 is formed on a position closest to the display area AA, and thereby the length of traces of the data lines DL can be reduced, so that the transmission delay of a data signal can be reduced.

The circuit placement area NA11 can be positioned between the first fan-out area NA12 and the display area AA. The first fan-out area NA12 can be positioned between the circuit placement area NA11 and the bending area NA13. The bending area NA13 can be positioned between the first fan-out area NA12 and the second fan-out area NA14.

The data lines DL and sub-pixels 10 which exhibit an array distribution can be located in the display area AA. The driving circuit 300 can be a driving chip, and an output terminal of the driving circuit 300 can be an output pin of the driving chip.

In one of embodiments, the display panel further includes a test circuit 400. The test circuit 400 is electrically connected to the multiplexing circuit 200, and is used for lighting test and the like of the display panel. The test circuit 400 can be located in the second fan-out area NA14, and can be located between the driving circuit 300 and the bending area NA13.

In one of embodiments, the present embodiment provides a display device including the display panel according to any one of the above embodiments.

In the display device of the present embodiment, it should be understood that the at least one odd-numbered thin film transistor can be sequentially turned on to charge sub-pixels of a corresponding odd-numbered row before charging the sub-pixels of any one of the odd-numbered rows is finished, the at least one even-numbered thin film transistor can be sequentially turned on to charge sub-pixels of a corresponding even-numbered row before charging the sub-pixels of any one of the even-numbered rows is finished, by electrically connecting the output terminal of the driving circuit 300 to the input terminal of the odd-numbered thin film transistor and the input terminal of the even-numbered thin film transistor in the same multiplexing module 210, electrically connecting the output terminal of one of the at least one odd-numbered thin film transistor to the corresponding odd-numbered data line, electrically connecting the output terminal of one of the at least one even-numbered thin film transistor to the corresponding even-numbered data line, electrically connecting the (2N−1)-th data line to the sub-pixels of the odd-numbered rows in the N-th column of sub-pixels, and electrically connecting the (2N)-th data line to the sub-pixels of the even-numbered rows in the N-th column of sub-pixels, thereby saving the number of uses of data traces and thin film transistors, as well as enhancing the timeliness of data signal transmission.

In one of embodiments, the display panel of the present disclosure may be but not limited to a self-luminous display panel such as an active matrix organic light emitting display panel or an inorganic light-emitting display panel, and may also be a liquid crystal display panel. The inorganic light-emitting display panel can be a Mini-LED display panel or a Micro-LED display panel. The organic light emitting display panel can be an OLED display panel.

It should be understood that, person skilled in the art can be achieve that equivalent replacement or improvement is according to the technical solutions and invention concept of the present disclosure, and all these improvements and replacements should be considered to belong to the protection scope of the claims of the present disclosure.

What is claimed is:

1. A display panel, comprising:
    a sub-pixel array, wherein a first column of sub-pixels to an N-th column of sub-pixels are sequentially arranged along a first direction in the sub-pixel array, a first row of sub-pixels to an M-th row of sub-pixels are sequentially arranged along a second direction in the sub-pixel array, and M and N are each a positive integer;
    a plurality of data lines, wherein the plurality of data lines are sequentially arranged along the first direction, a (2N−1)-th data line located at one side of the N-th column of sub-pixels is electrically connected to sub-pixels of odd-numbered rows in the N-th column of sub-pixels, and a (2N)-th data line located at another side of the N-th column of sub-pixels is electrically connected to sub-pixels of even-numbered rows in the N-th column of sub-pixels;
    a multiplexing circuit, wherein the multiplexing circuit comprises at least one multiplexing module, the multiplexing module comprises at least one odd-numbered thin film transistor and at least one even-numbered thin film transistor, an output terminal of one of the at least one odd-numbered thin film transistor is electrically connected to a corresponding odd-numbered data line, and an output terminal of one of the at least one even-numbered thin film transistor is electrically connected to a corresponding even-numbered data line; and
    a driving circuit, wherein an output terminal of the driving circuit is electrically connected to an input terminal of the odd-numbered thin film transistor and an input terminal of the even-numbered thin film transistor in the same multiplexing module,
    wherein the at least one odd-numbered thin film transistor is sequentially turned on before charging the sub-pixels of any one of the odd-numbered rows is finished in the display panel; and the at least one even-numbered thin film transistor is sequentially turned on before charging the sub-pixels of any one of the even-numbered rows is finished in the display panel;
    wherein the display panel further comprises:
    a plurality of scanning lines, in which the plurality of scanning lines are sequentially arranged along the second direction, an M-th scanning line is electrically connected to the M-th row of sub-pixels, and the M-th scanning line is used for transmitting a corresponding scanning signal to control a charging start time and a charging end time of corresponding row of sub-pixels,
    wherein the at least one odd-numbered thin film transistor is sequentially turned on to pre-charge a data signal to a corresponding odd-numbered data line before the charging start time of the sub-pixels of any one of the odd-numbered rows; and the at least one even-numbered thin film transistor is sequentially turned on to pre-charge a data signal to a corresponding even-numbered data line before the charging start time of the sub-pixels of any one of the even-numbered rows.

2. The display panel of claim 1, wherein the at least one odd-numbered thin film transistor and the at least one even-numbered thin film transistor are alternately arranged in sequence along the first direction; the at least one odd-numbered thin film transistor is sequentially turned on along the first direction before charging the sub-pixels of any one of the odd-numbered rows is finished in the display panel; and the at least one even-numbered thin film transistor is sequentially turned on along the first direction before charging the sub-pixels of any one of the even-numbered rows is finished in the display panel.

3. The display panel of claim 1, wherein the data signal is charged to sub-pixels of a corresponding odd-numbered row at the charging start time of the sub-pixels of any one of the odd-numbered rows; and the data signal is charged to sub-pixels of a corresponding even-numbered row at the charging start time of the sub-pixels of any one of the even-numbered rows.

4. The display panel of claim 3, wherein the at least one even-numbered thin film transistor is sequentially turned on to pre-charge the data signal to the corresponding even-numbered data line after the charging start time of an (2M−1)-th row of sub-pixels, before the charging start time of an (2M)-th row of sub-pixels; and the at least one odd-numbered thin film transistor is sequentially turned on to pre-charge the data signal to the corresponding odd-numbered data line after the charging start time of the (2M)-th row of sub-pixels, before the charging start time of an (2M+1)-th row of sub-pixels.

5. The display panel of claim 4, wherein the display panel further comprises:

a plurality of first traces, in which one of the first traces is electrically connected to a gate electrode of one of the at least one odd-numbered thin film transistor, and is used for transmitting a plurality of first strobe signals with a successive change in phase; and a plurality of second traces, in which one of the second traces is electrically connected to a gate electrode of one of the at least one even-numbered thin film transistor, and is used for transmitting a plurality of second strobe signals with a successive change in phase, wherein a pulse of a (2M−1)-th stage scanning signal and a pulse of at least one of the second strobe signals are within a same time segment; a start time of the pulse of the (2M−1)-th stage scanning signal is within a pulse of one of the first strobe signals, and the (2M−1)-th stage scanning signal is a scanning signal transmitted from a (2M−1)-th scanning line.

6. The display panel of claim 1, wherein the multiplexing module comprises:

a first odd-numbered thin film transistor, in which one of a source electrode and a drain electrode of the first odd-numbered thin film transistor is electrically connected to a first data line;

a second odd-numbered thin film transistor, in which one of a source electrode and a drain electrode of the second odd-numbered thin film transistor is electrically connected to a third data line;

a first even-numbered thin film transistor, in which one of a source electrode and a drain electrode of the first even-numbered thin film transistor is electrically connected to a second data line; and a second even-numbered thin film transistor, in which one of a source electrode and a drain electrode of the second even-numbered thin film transistor is electrically connected to a fourth data line, wherein the driving circuit comprises a first output terminal, and the first output terminal is electrically connected to another one of the source electrode and the drain electrode of the first odd-numbered thin film transistor, another one of the source electrode and the drain electrode of the second odd-numbered thin film transistor, another one of the source electrode and the drain electrode of the first even-numbered thin film transistor, and another one of the source electrode and the drain electrode of the second even-numbered thin film transistor.

7. The display panel of claim 6, wherein the multiplexing module further comprises:

a third odd-numbered thin film transistor, in which one of a source electrode and a drain electrode of the third odd-numbered thin film transistor is electrically connected to a fifth data line, and another one of the source electrode and the drain electrode of the third odd-numbered thin film transistor is electrically connected to the first output terminal; and a third even-numbered thin film transistor, in which one of a source electrode and a drain electrode of the third even-numbered thin film transistor is electrically connected to a sixth data line, and another one of the source electrode and the drain electrode of the third even-numbered thin film transistor is electrically connected to the first output terminal.

8. The display panel of claim 7, wherein the multiplexing module further comprises:

a fourth odd-numbered thin film transistor, in which one of a source electrode and a drain electrode of the fourth odd-numbered thin film transistor is electrically connected to a seventh data line, and another one of the source electrode and the drain electrode of the fourth odd-numbered thin film transistor is electrically connected to the first output terminal; and a fourth even-numbered thin film transistor, in which one of a source electrode and a drain electrode of the fourth even-numbered thin film transistor is electrically connected to an eighth data line, and another one of the source electrode and the drain electrode of the fourth even-numbered thin film transistor is electrically connected to the first output terminal.

9. The display panel of claim 1, wherein the display panel further comprises:

a display area, in which the plurality of data lines are located in the display area; and a non-display area, in which the non-display area comprises a first non-display sub-area, the first non-display sub-area comprises a circuit placement area, a first fan-out area, a bending area and a second fan-out area that are respectively progressively farther from the display area, and the multiplexing circuit is disposed on the circuit placement area.

10. A display device, comprising the display panel according to claim 1, wherein the display panel is a self-luminous display panel or a liquid crystal display panel.

11. The display device of claim 10, wherein the at least one odd-numbered thin film transistor and the at least one even-numbered thin film transistor are alternately arranged in sequence along the first direction; the at least one odd-numbered thin film transistor is sequentially turned on along the first direction before charging the sub-pixels of any one of the odd-numbered rows is finished in the display panel; and the at least one even-numbered thin film transistor is sequentially turned on along the first direction before charging the sub-pixels of any one of the even-numbered rows is finished in the display panel.

12. The display device of claim 10, wherein the data signal is charged to sub-pixels of a corresponding odd-numbered row at the charging start time of the sub-pixels of any one of the odd-numbered rows; and the data signal is charged to sub-pixels of a corresponding even-numbered row at the charging start time of the sub-pixels of any one of the even-numbered rows.

13. The display device of claim 12, wherein the at least one even-numbered thin film transistor is sequentially turned on to pre-charge the data signal to the corresponding even-numbered data line after the charging start time of an (2M−1)-th row of sub-pixels, before the charging start time of an (2M)-th row of sub-pixels; and
the at least one odd-numbered thin film transistor is sequentially turned on to pre-charge the data signal to the corresponding odd-numbered data line after the charging start time of the (2M)-th row of sub-pixels, before the charging start time of an (2M+1)-th row of sub-pixels.

14. The display device of claim 13, wherein the display panel further comprises:
a plurality of first traces, in which one of the first traces is electrically connected to a gate electrode of one of the at least one odd-numbered thin film transistor, and is used for transmitting a plurality of first strobe signals with a successive change in phase; and
a plurality of second traces, in which one of the second traces is electrically connected to a gate electrode of one of the at least one even-numbered thin film transistor, and is used for transmitting a plurality of second strobe signals with a successive change in phase,
wherein a pulse of a (2M−1)-th stage scanning signal and a pulse of at least one of the second strobe signals are within a same time segment; a start time of the pulse of the (2M−1)-th stage scanning signal is within a pulse of one of the first strobe signals, and the (2M−1)-th stage scanning signal is a scanning signal transmitted from a (2M−1)-th scanning line.

15. The display device of claim 10, wherein the multiplexing module comprises:
a first odd-numbered thin film transistor, in which one of a source electrode and a drain electrode of the first odd-numbered thin film transistor is electrically connected to a first data line;
a second odd-numbered thin film transistor, in which one of a source electrode and a drain electrode of the second odd-numbered thin film transistor is electrically connected to a third data line;
a first even-numbered thin film transistor, in which one of a source electrode and a drain electrode of the first even-numbered thin film transistor is electrically connected to a second data line; and
a second even-numbered thin film transistor, in which one of a source electrode and a drain electrode of the second even-numbered thin film transistor is electrically connected to a fourth data line,
wherein the driving circuit comprises a first output terminal, and the first output terminal is electrically connected to another one of the source electrode and the drain electrode of the first odd-numbered thin film transistor, another one of the source electrode and the drain electrode of the second odd-numbered thin film transistor, another one of the source electrode and the drain electrode of the first even-numbered thin film transistor, and another one of the source electrode and the drain electrode of the second even-numbered thin film transistor.

16. The display device of claim 15, wherein the multiplexing module further comprises:
a third odd-numbered thin film transistor, in which one of a source electrode and a drain electrode of the third odd-numbered thin film transistor is electrically connected to a fifth data line, and another one of the source electrode and the drain electrode of the third odd-numbered thin film transistor is electrically connected to the first output terminal; and
a third even-numbered thin film transistor, in which one of a source electrode and a drain electrode of the third even-numbered thin film transistor is electrically connected to a sixth data line, and another one of the source electrode and the drain electrode of the third even-numbered thin film transistor is electrically connected to the first output terminal.

17. The display device of claim 16, wherein the multiplexing module further comprises:
a fourth odd-numbered thin film transistor, in which one of a source electrode and a drain electrode of the fourth odd-numbered thin film transistor is electrically connected to a seventh data line, and another one of the source electrode and the drain electrode of the fourth odd-numbered thin film transistor is electrically connected to the first output terminal; and
a fourth even-numbered thin film transistor, in which one of a source electrode and a drain electrode of the fourth even-numbered thin film transistor is electrically connected to an eighth data line, and another one of the source electrode and the drain electrode of the fourth even-numbered thin film transistor is electrically connected to the first output terminal.

18. The display device of claim 10, wherein the display panel further comprises:
a display area, in which the plurality of data lines are located in the display area; and
a non-display area, in which the non-display area comprises a first non-display sub-area, the first non-display sub-area comprises a circuit placement area, a first fan-out area, a bending area and a second fan-out area that are respectively progressively farther from the display area, and the multiplexing circuit is disposed on the circuit placement area.

* * * * *